United States Patent [19]
Tokumitsu et al.

[11] Patent Number: 6,008,511
[45] Date of Patent: Dec. 28, 1999

[54] SOLID-STATE IMAGE SENSOR DECREASED IN SHADING AMOUNT

[75] Inventors: Kenichi Tokumitsu, Yokohama; Atsushi Honjoh, Setagaya-ku, both of Japan

[73] Assignee: Kabushiki Kaisha Toshiba, Kawasaki-shi, Japan

[21] Appl. No.: 08/954,082

[22] Filed: Oct. 20, 1997

[30] Foreign Application Priority Data

Oct. 21, 1996 [JP] Japan ................................. 8-278411

[51] Int. Cl.$^6$ .................... H01L 27/148; H01L 29/768
[52] U.S. Cl. .................... 257/232; 257/233; 257/432; 257/440
[58] Field of Search .................... 257/232, 233, 257/432, 440

[56] References Cited

U.S. PATENT DOCUMENTS 5,493,143 2/1996 Hokari ................................. 257/432
5,576,562 11/1996 Konuma ............................. 257/232
5,583,354 12/1996 Ishiba ................................. 257/232

FOREIGN PATENT DOCUMENTS 8-116041 5/1996 Japan .

*Primary Examiner*—Ngân V. Ngô
*Attorney, Agent, or Firm*—Finnegan, Henderson, Farabow, Garrett & Dunner, L.L.P.

[57] ABSTRACT

In a solid-state image sensor, first color filters for a first color and associated photodiodes are disposed with a uniform pitch in all pixels in a chip. As to microlenses, however, those in pixels located in a central area of the chip are disposed to substantially align with aperture centers of the pixels, and those in pixels distant from the center of the chip are disposed to shift their centers from aperture centers of the pixels by first shift amounts (offset amounts) in a direction toward the chip center or chip peripheries. The first shift amounts are determined, depending on the wavelength of the first color, to increase in a predetermined rate from the chip center toward the chip ends. Second shift amounts for shifting microlenses in pixels for a second color are determined to increase from the chip center toward the chip ends in a rate different from the rate of the first shift amounts accounting the wavelength of the first color.

17 Claims, 10 Drawing Sheets

| Ye | Cy |
|----|----|
| G  | Mg |
| Ye | Cy |
| Mg | G  |

FIG. 2A

| $G_1$ | R     |
|-------|-------|
| B     | $G_2$ |
| $G_1$ | R     |
| B     | $G_2$ |

FIG. 2B

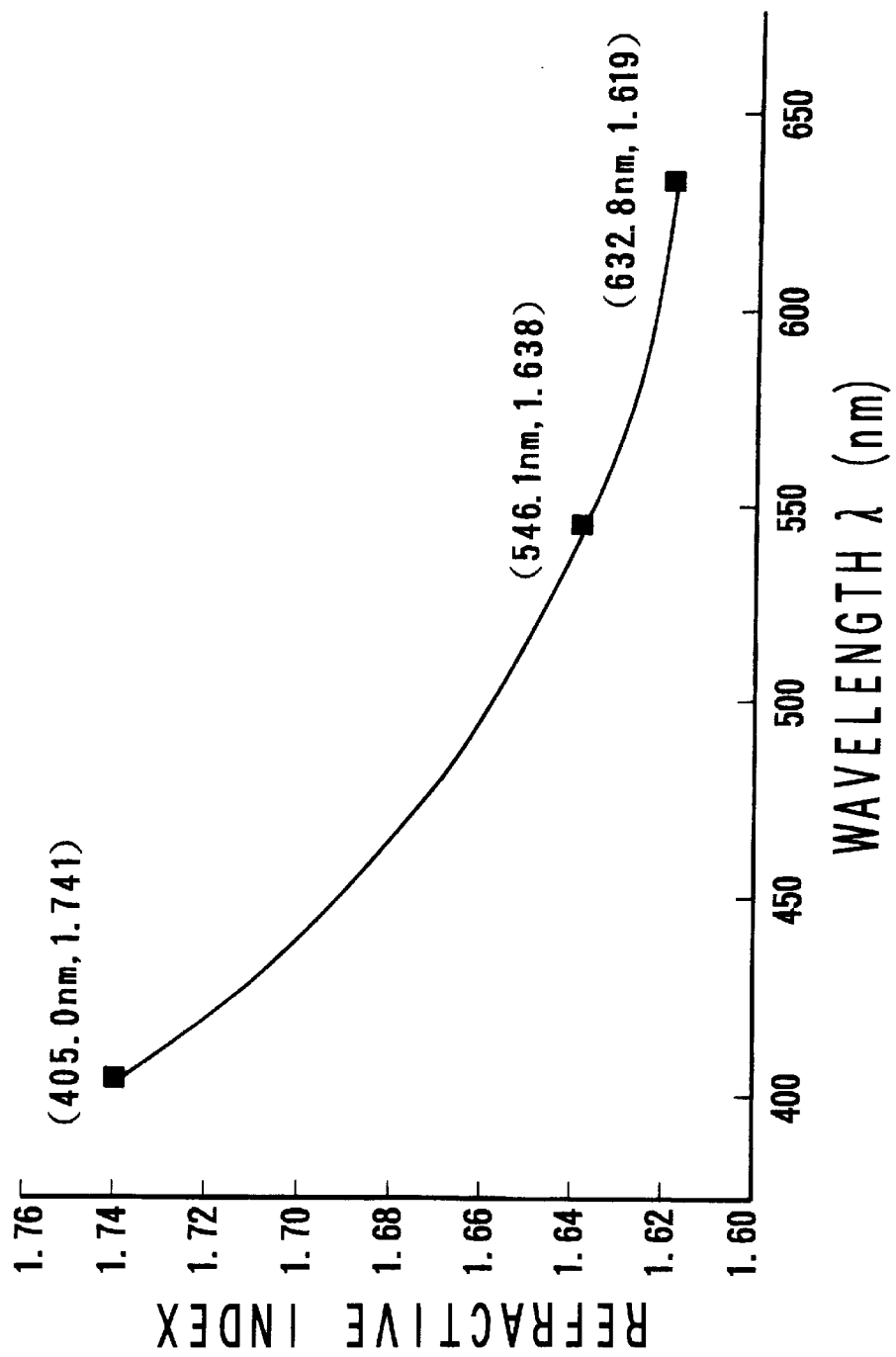

SOLID-STATE IMAGE SENSOR DECREASED IN SHADING AMOUNT

BACKGROUND OF THE INVENTION

This invention relates to a solid state image sensor and, in particular, to a solid state image sensor decreased in shading amount.

Shading has been an issue of conventional solid-state image sensors, and studies have been made for decreasing the shading amount. Shading pertains to the phenomenon that incident light applied with a uniform intensity to the entirety of a solid-state image sensor is actually received unevenly, with a certain attenuation amount especially at end portions of the solid-state image sensor, and the attenuation amount is called shading amount.

FIG. 6 is an explanatory diagram of such shading amounts.

As shown in FIG. 6, even when image signal light is uniformly applied in the period of 1H of image signals, for example, as shown by the solid line, the signal actually received by a solid-state image sensor may attenuate at end portions thereof as shown by the broken line. The amount of the attenuation is the shading amount. Possible causes of shading are, for example, unevenness of lenses and differences in optical pick-up rate between the center and ends of the solid-state image sensor.

FIG. 7 shows a conventional solid-state image sensor in a cross-sectional view.

The solid-state image sensor 1 includes microlenses 17a through 17c, smoothing layer 16, color filters 15a through 15c, insulation layer 14, shade films 13a through 13c, electrodes 12a through 12c, photodiodes 18a through 18c, and semiconductor substrate 11. Adjacent color filters 15a and 15b are appropriately selected to pass different colors. The microlens 17a, color filter 15a, shade film 13a, electrode 12a and photodiode 18a, for example, form a single pixel. Incident light enters through the microlens 17a, and a predetermined color contained in the incident light is filtered through the microlens 17a, then converted into an electric signal by the photodiode 18a, and transmitted by the electrode 12a, etc.

In the conventional solid-state image sensor, the microlenses 17a to 17c are disposed so that their pitch or center axes disagree with the pitch or center axes of the pixels.

FIG. 8 is a cross-sectional view for explaining a positional relation in the conventional solid-state image sensor designed to decrease the shading amount.

In FIG. 8, color filters 82-0, 82-2, 82-4 pass a first color whereas color filters 82-1 and 82-3 pass a second color different from the first color.

In a pixel in a central portion of the chip of the solid-state image sensor, the microlens 81-0 is disposed to locate its center in substantial agreement with the aperture center, namely, centers of the color filter 82-0 and the photodiode 83-0. On the other hand, in pixels in peripheral portions of the chip, the microlenses 81-1 through 81-4 are disposed to deviate their centers from the aperture centers toward the center or peripheries of the chip by shift amounts (offset amounts) d1 through d4 which progressively increase toward the chip ends. Here, pitches of the color filters 82-0 through 82-3 and photodiodes 83-0 through 83-4 forming pixels are constant in all pixels in the chip.

In FIG. 8, distances from the photodiodes 83-1 through 83-4 as aperture centers to centers of the microlenses 81-1 through 81-4 are substantially equal in adjacent pixels having different color filters, although slightly larger in peripheral portions of the chip.

In this manner, sufficient light can enter into photodiodes even when the angle of incidence of light is slanted.

In conventional technologies, the pitch of microlenses is uniform in any kinds of color pixels. Therefore, offset amounts of microlenses from aperture centers are substantially equal in pixels substantially equally distant from the chip center, regardless of the color pixels being of different types or not, even though there may be a slight difference.

However, since refractive indices of microlens are different depending on wavelengths, positions of focal points of microlenses relative to apertures of color pixels in peripheral portions of the chip are different among different kinds of color filters of the pixels. Therefore, conventional technologies cannot minimize shading amounts simultaneously for all color outputs.

SUMMARY OF THE INVENTION

It is therefore an object of the invention to provide a solid-state image sensor enabling simultaneous minimization of shading amounts of respective color outputs for each color, reduction of color shading amounts and improvement of the yield of products.

According to the invention, pitches or shift amounts of microlenses on respective color pixels are determined independently for each kind of color pixels. That is, in color pixels, the pitch or shift amount is determined for each color so as to bring the focal point of the microlens nearest to the aperture center. The invention can minimize the shading amount of each color output independently for individual colors.

According to a first aspect of the invention, there is provided a solid-state image sensor comprising:

a plurality of first color filters located with a constant pitch;

a plurality of first lenses each associated with each first color filter, the first lenses being located at first positions offset from center positions of the first color filters by first distances toward ends of the solid-state image sensor, the first distances increasing in a first rate from the center of the solid-state image sensor toward its ends;

a plurality of first photodiodes located at the center positions of the first color filters with a constant pitch;

a plurality of second color filters located between adjacent first color filters with a constant pitch;

a plurality of second lenses each associated with each second color filter, the second lenses being located at second positions offset from center positions of the second color filters by second distances toward ends of the solid-state image sensor, the second distances increasing in a second rate from the center of the solid-state image sensor toward its ends; and a plurality of second photodiodes located at the center positions of the second color filters with a constant pitch.

BRIEF DESCRIPTION OF THE DRAWINGS

FIGS. 2A and 2B are diagrams showing patterns of color filters;

FIG. 5 is a diagram showing changes in refractive index of a microlens depending on wavelengths;

DESCRIPTION OF PREFERRED EMBODIMENTS

Figure 1:
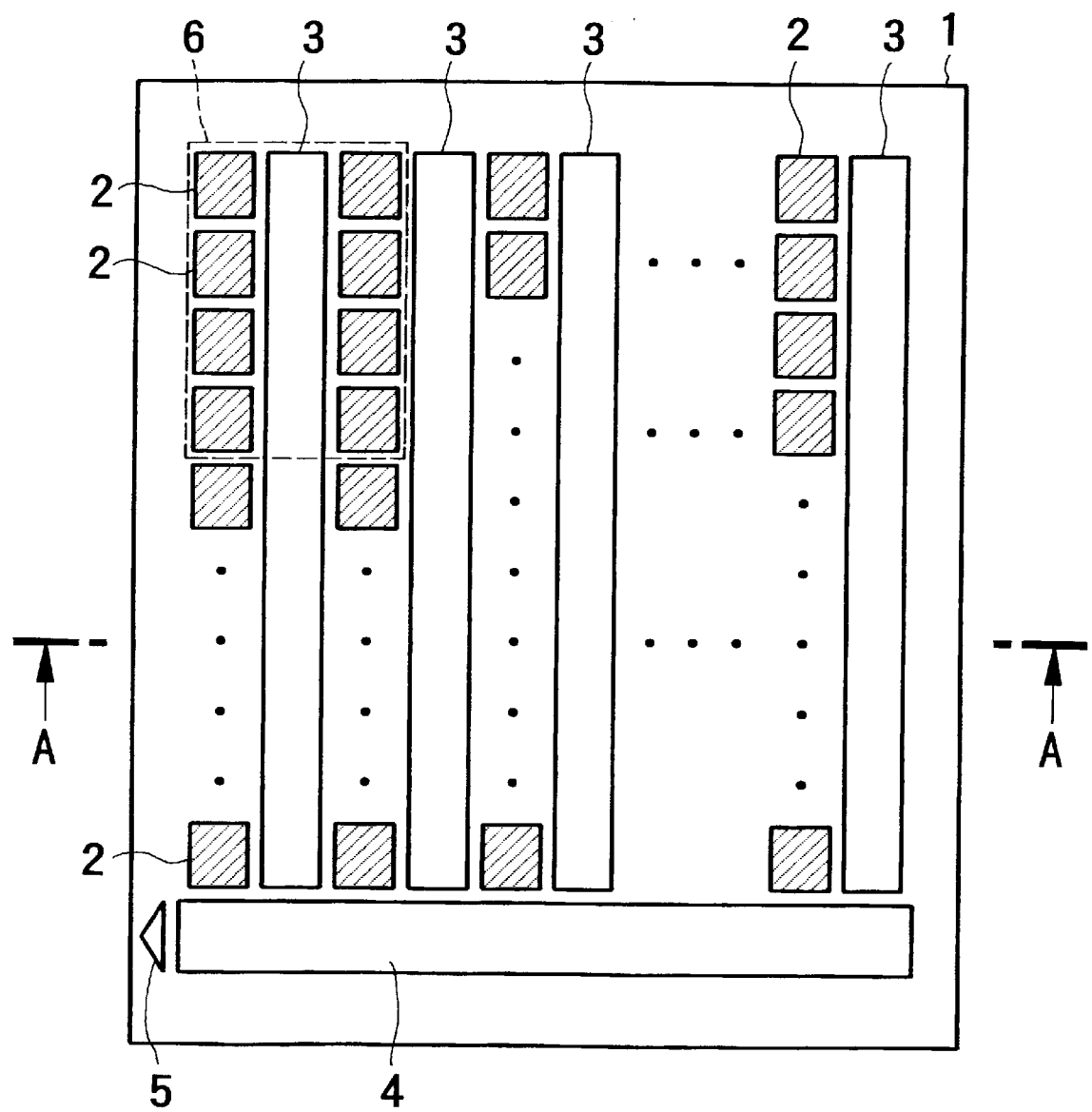
FIG. 1 is a plan view of a solid-state image sensor related to the present invention.

FIG. 1 is a plan view of a solid-state image sensor taken as an embodiment of the invention.

The solid-state image sensor 1 includes a plurality of pixels 2. It further includes a vertical CCD (charge-coupled device) 3 for a plurality of pixels 2 in each row, and a horizontal CCD 4 and an output circuit 5 for a plurality of vertical CCDs.

Figures 2A, 2B:
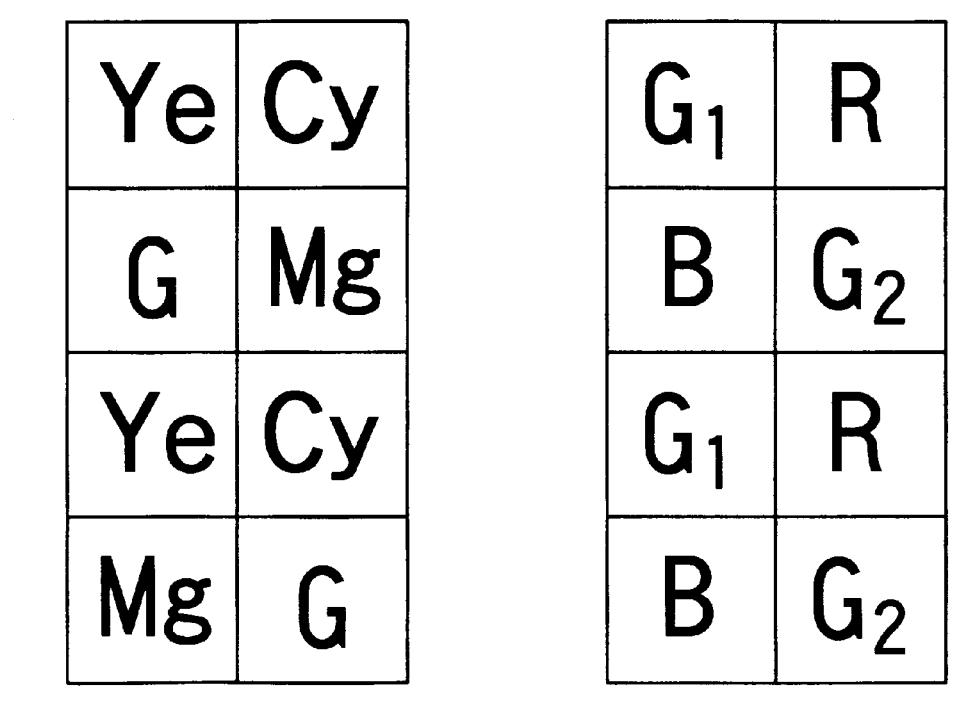

In the pixels 2, color filters in each region 6, for example, form a pattern, and the pattern is repeated in the entirety of the solid-state image sensor. FIGS. 2A and 2B show patterns of color filters.

The pattern of FIG. 2A is a combination of complementary colors. Cy is cyan, G is green, Ye is yellow, and Mg is magenta. Wavelength bands (bands of visible light) to which individual color pixels are sensitive are, for example, 400 to 580 nm of Cy, 480 to 590 nm of G, 480 to 700 nm of Ye, and 400 to 490 nm and 570 to 700 nm of Mg, approximately. These wavelength bands are ranges acceptable for sensitivities half the peak sensitivities.

The pattern shown in FIG. 2B is a combination of primary colors. B is blue, G1 and G2 are green, and R is red. Wavelength bands (bands of visible light) to which individual color pixels are sensitive are, for example, 400 to 490 of B, 500 to 570 nm of G1 and G2, and 590 to 700 nm of R, approximately. G1 and G2, both green, have different positions relative to other color pixels (and hence have slightly different sensitivity characteristics).

Figure 3:
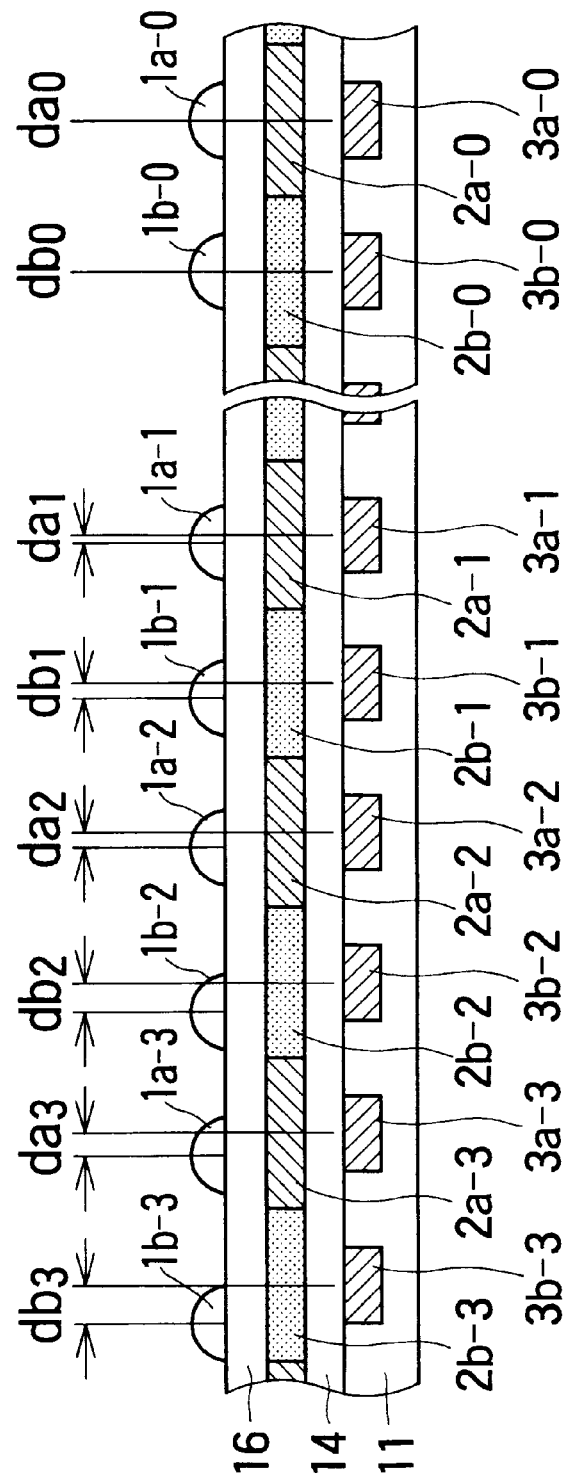
FIGS. 3, 3A, 3B and 3C are cross-sectional views of solid-state image sensors according to the invention, illustrating positional relations for decreasing shading amounts.

FIG. 3 is a cross-sectional view of the solid-state image sensor according to the invention for explaining positional relations used to decrease the shading amount.

Figure 7:
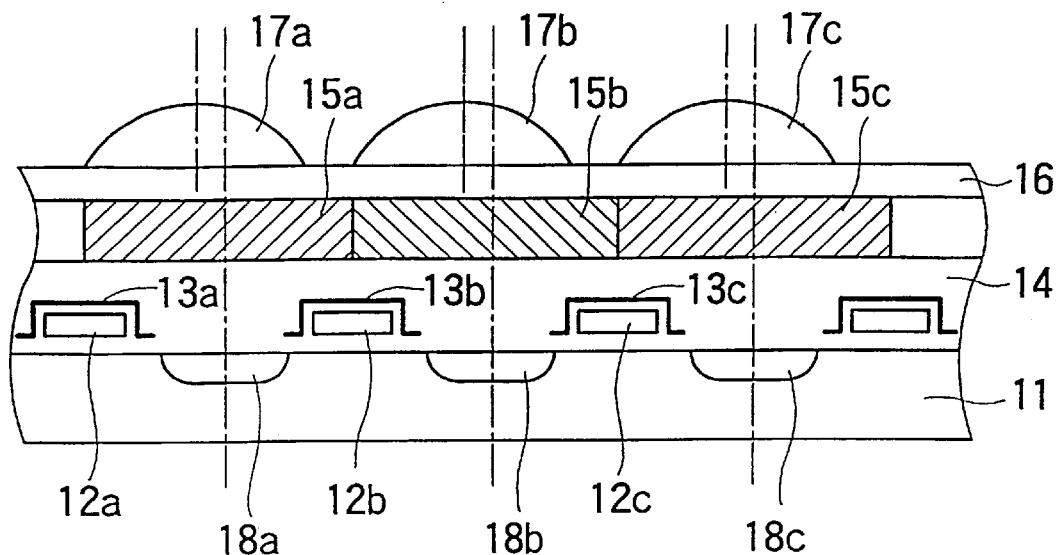
FIG. 7 is a cross-sectional view of a conventional solid-state image sensor.
Figure 8:
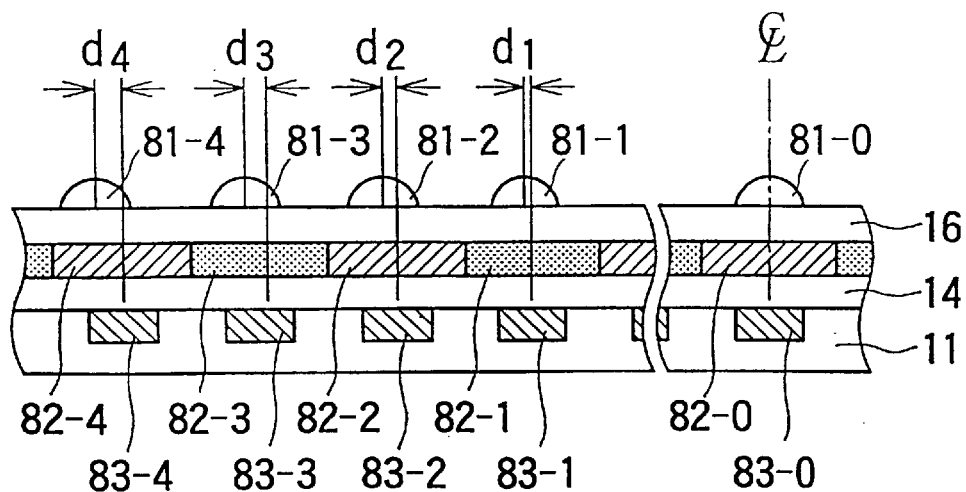
FIG. 8 is a cross-sectional view of a conventional solid-state image sensor, which illustrates positional relations for decreasing shading amounts.

The cross-sectional structure of pixels in peripheral portions of the chip of the solid-state image sensor in the present invention is substantially the same as that shown in FIG. 7. In the present invention, however, distances from aperture centers to centers of microlenses are different between pixels having a kind of color filters and pixels having another kind of color filters.

FIG. 3 is a sectional view taken along the A—A line of FIG. 1, and two different kinds of color pixels are aligned alternately.

Provided for the first color are first microlenses 1a-0 through 1a-3, first color filters 2a-0 through 2a-3, and photodiodes 3a-0 through 3a-3. For example, the first microlens 1a-0, first color filter 2a-0 and photodiode 3a-0 make up a single color pixel. Provided for the second color different from the first color are second microlenses 1b-0 through 1b-3, second color filters 2b-0 through 2b-3 and photodiodes 3b-0 through 3b-3.

In the present invention, the first color filters 2a-0 through 2a-3, photodiodes 3a-0 through 3a-3, forming pixels for the first color, are located with a constant pitch for all pixels in the chip. However, microlenses 1a-0 through 1a-3, etc. are positioned so that the microlens 1a-1, for example, be in substantial alignment with the aperture center, namely, with centers of the first color filter 2a-0 and photodiode 3a-0, in the pixel located in the center of the chip of the solid-state image sensor. On the other hand, in pixels in peripheral ends of the chip, centers of the microlenses 1a-1 through 1a-3 are offset ends from aperture centers toward the chip center or chip by first shift amounts (offset amounts) da1 through da3. The first shift amounts da1 through da3 are determined to increase by a predetermined rate depending on the wavelength of the first color as the pixels become distant from the center toward ends.

Similarly, for the second color, the second color filters 2b-0 through 2b-3 and photodiodes 3b-0 through 3b-3 forming pixels are positioned with a constant pitch in all pixels in the chip. However, microlenses 1b-0 through 1b-3 are positioned so that the microlens 1b-1, for example, be substantially aligned with the aperture center, namely, centers of the second color filter 2b-0 and photodiode 3b-0 in the pixel at the chip center of the solid-state image sensor. On the other hand, in pixels in chip ends, centers of the microlenses 1a-1 through 1a-3 are offset from aperture centers toward the chip center or chip ends by second shift amounts (offset amounts) db1 through db3. The second shift amounts db1 through db3 are determined to increase by a predetermined rate different from the rate of the first shift amount da1 through da3 for the wavelength of the first color as the pixels become distant from the center toward the chip ends.

In this embodiment, the pitch of microlenses 1a in pixels for a certain color id different from the pitch of microlenses 1b in pixels for a different color. Therefore, first shift amounts of centers of microlenses 1a from aperture centers of color filters 2a and the increasing rate of shift amounts toward chip ends in pixels having color filters for a color are different from those in pixels having color filters for another color. Moreover, pitches and locations of microlenses 1a and 1b are determined respectively to bring focuses of microlenses nearest to aperture centers. Rates of values of the first and second shift amounts are determined appropriately, accounting materials of lenses, wavelengths of the first and second colors, and other factors.

Figure 3A:
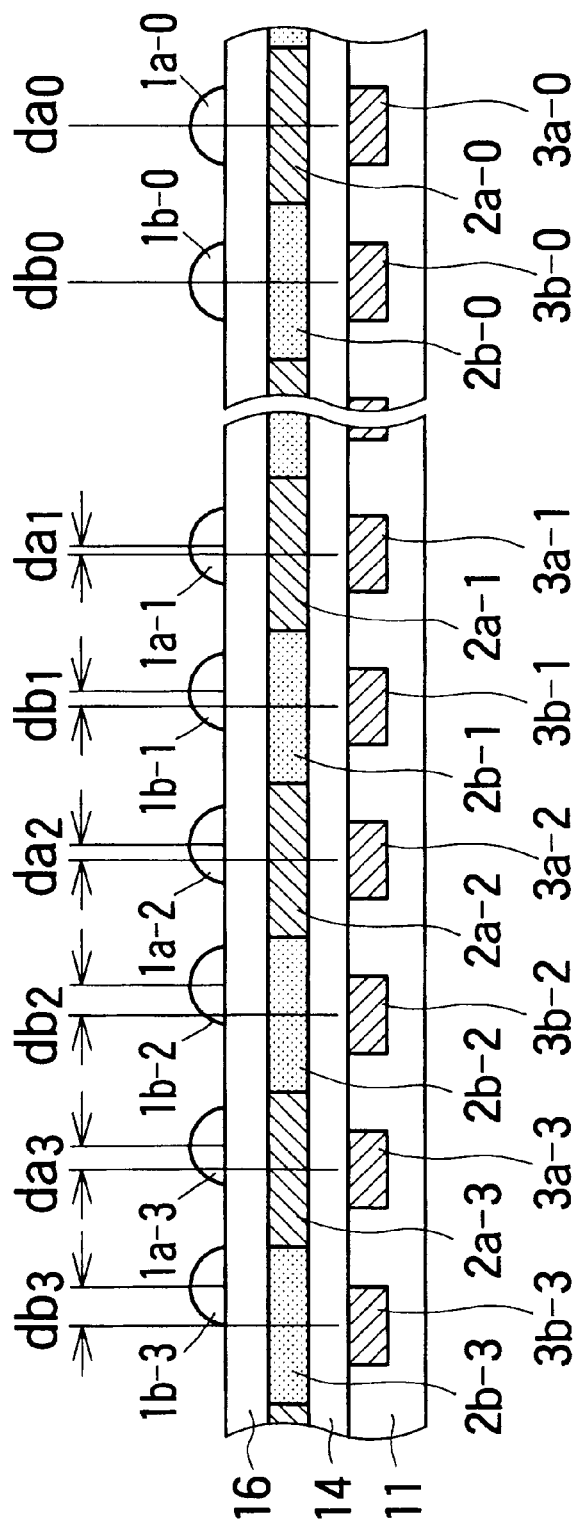

In the arrangement shown in FIG. 3, microlenses are shifted outwardly. However, as shown in FIG. 3A, they may be shifted inwardly.

Next made is an explanation on spectral sensitivities and refractive indices, and a way of determining the rates of the shift amounts.

Figure 4A:
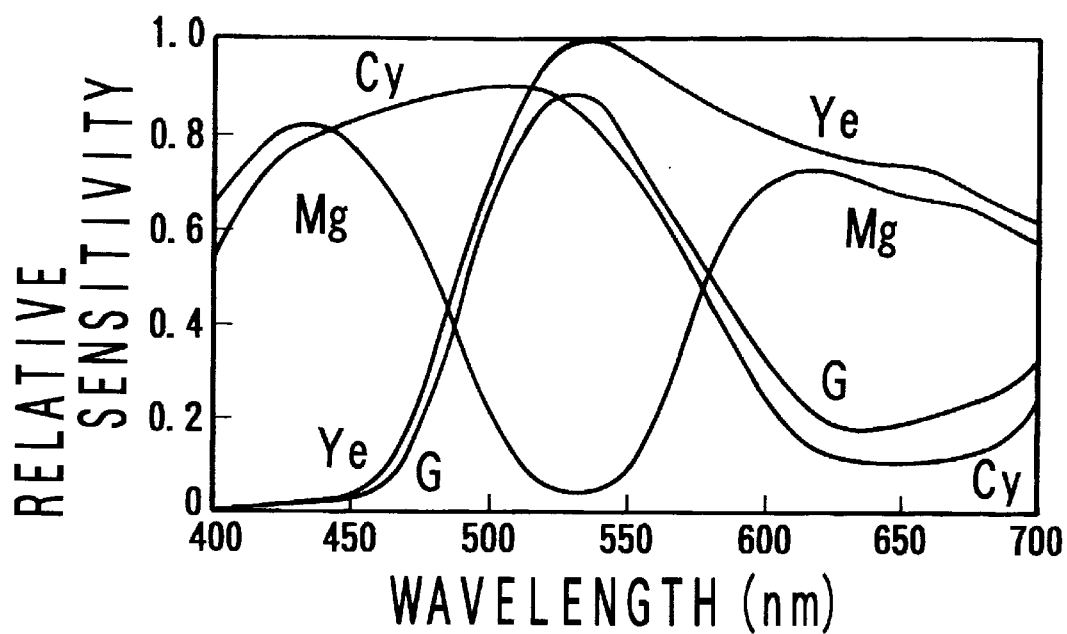
FIGS. 4A and 4B are diagrams showing spectral sensitivity characteristics of various colors.
Figure 4B:
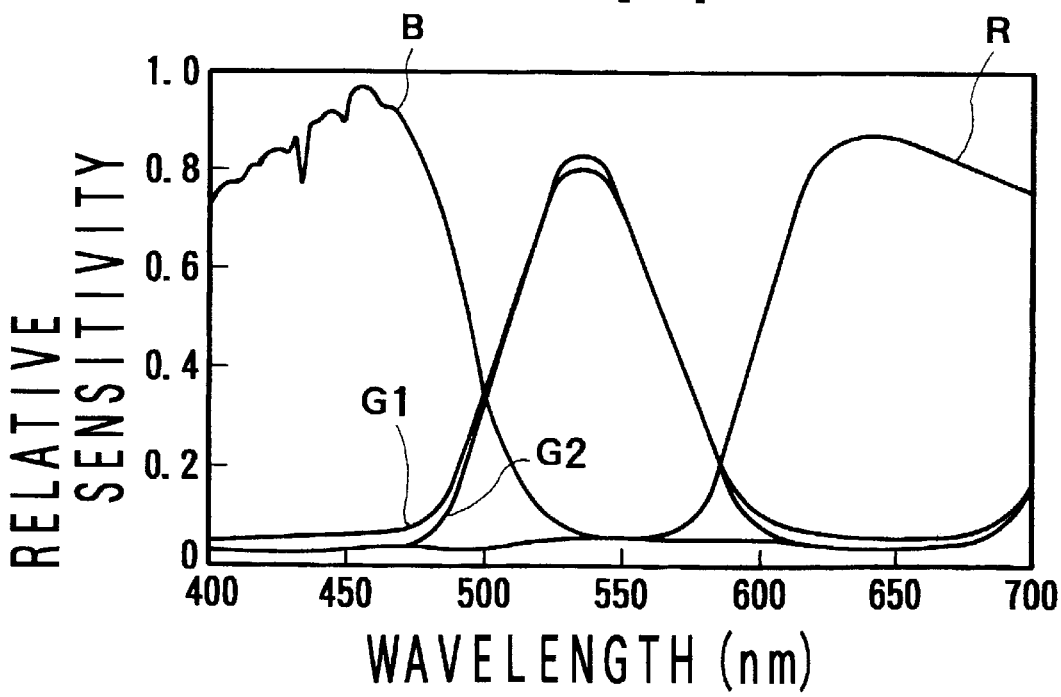
Figure 6:
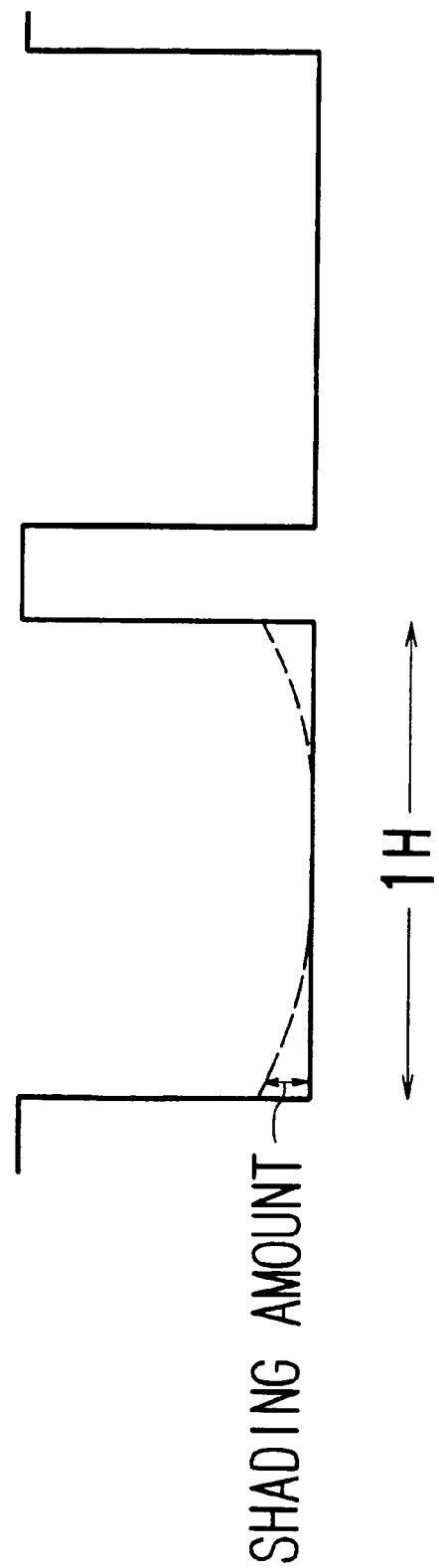
FIG. 6 is a diagram for explaining shading amounts.

FIGS. 4A and 4B show spectral sensitivity characteristics of individual colors. Spectral sensitivities shown in FIG. 4A are those of color CCDs (charge-coupled devices) for complementary colors, and spectral sensitivities shown in FIG. 4B are those of color CCD for primary colors.

Additionally, FIG. 5 shows a dependency of refractive indices of microlenses upon wavelengths.

Refractive indices vary with materials of microlenses as well. An example is shown here as using a certain material, but it is similarly applicable also to other materials.

In FIG. 5, within the range of visible light, a difference in refractive index, slightly more than 0.1, is produced between a short wavelength and a long wavelength. The difference is used to determine values of refractive indices relative to effective incident light in each color pixel. Relative values of the refractive indices are as follows, referring to FIGS. 4a, 4b and 5.

For complementary colors: Cy≧G≧Ye

For primary colors: B>G>R

Since the refractive index becomes high in case of light of a short wavelength, deviation of the focal point of incident light from the center of a pixel becomes larger for incident light of a short wavelength than that for incident light of a long wavelength. When effective incident light slantwise entering from an end of the solid-state image sensor is refracted largely, the shift amounts of the microlenses 1a, 1b from the color filters 2a, 2b must be large.

In a horizontal row having adjacent G (green) and B (blue) in a version using primary color filters, B is shorter in wavelength and larger in refractive index than G. Then, the deviation of the focal point of incident light from a pixel center in a peripheral location is larger in a B pixel than in a G pixel. Therefore, shading amounts can be minimized by increasing shift amounts of the microlenses and increasing the rate of shift amounts toward peripheral ends in B pixels more than in G pixels.

This is applicable also to other combinations of color filters in the horizontal direction, using patterns as shown in FIGS. 2A and 2B.

Moreover, also in any combinations of primary colors or complementary colors other than those shown in FIG. 2A and 2B, shift amounts, etc., can be determined similarly.

To actually design a solid-state image sensor, optimum shift amounts, lens locations, and so on, can be determined, for example, through logical calculation or simulation, or through measurement of some kinds of devices actually made as models.

Although the embodiment has been explained as arranging color pixels in the horizontal direction, the invention is similarly applicable also when they are arranged in the vertical direction.

Figure 3B:
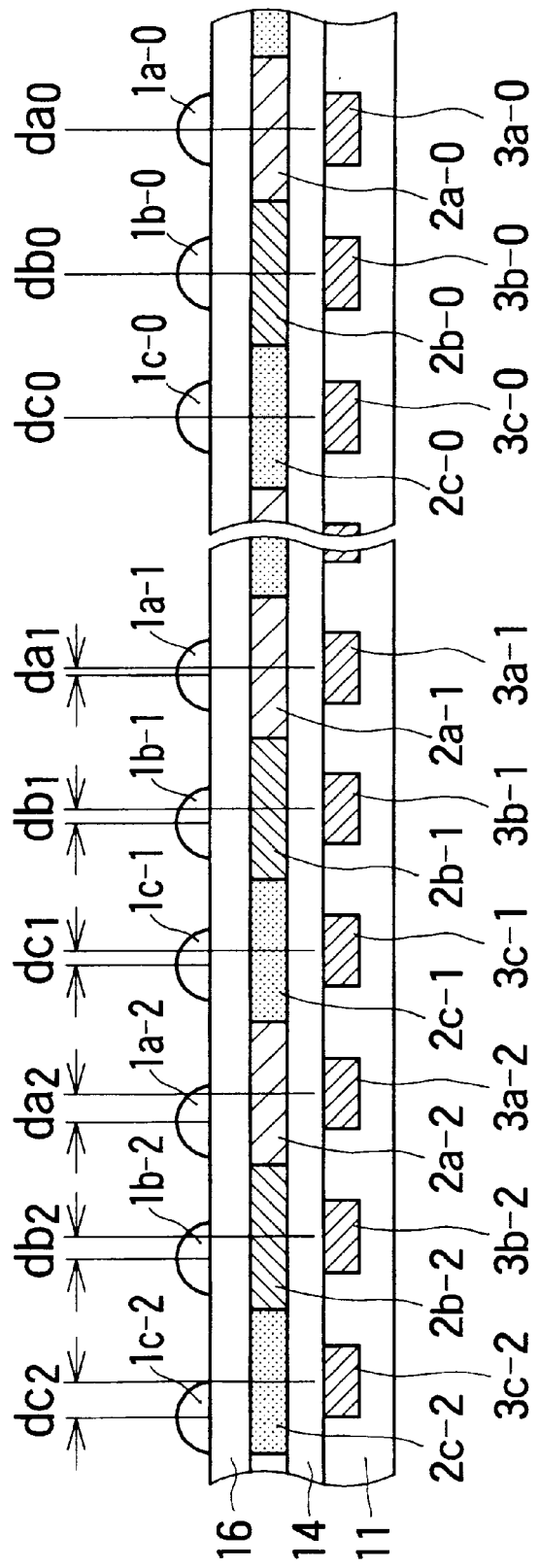
Figure 3C:
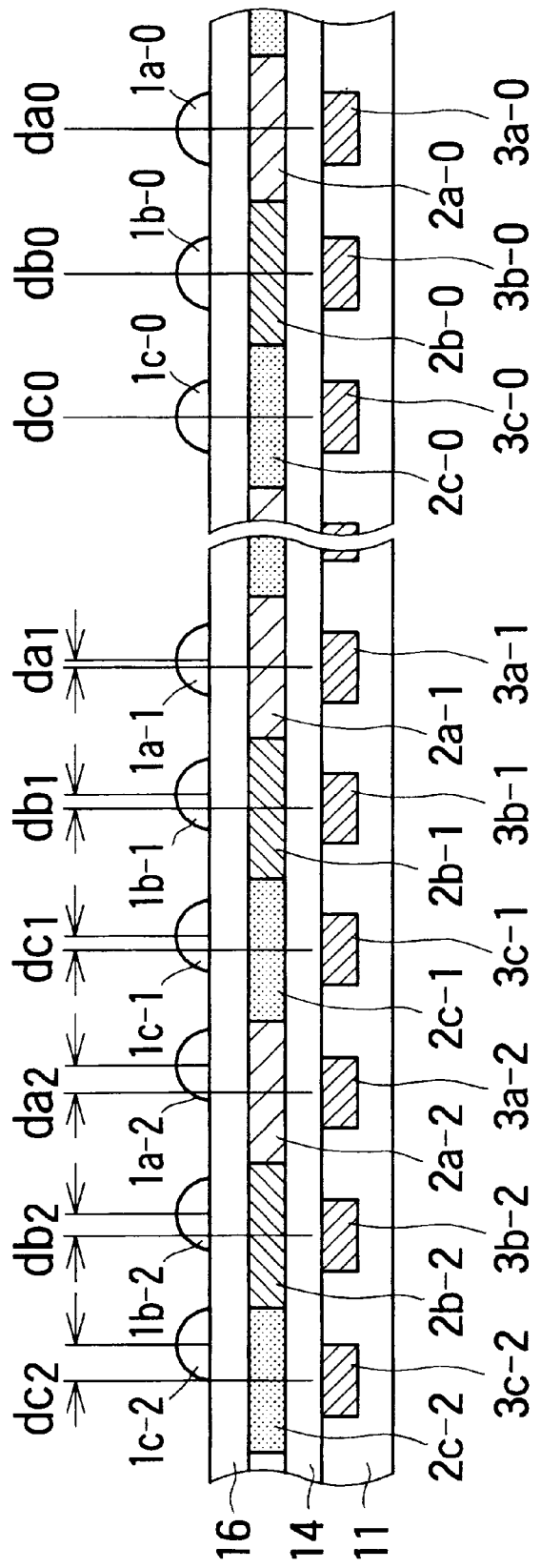

Instead of alternately arranging two kinds of color pixels as explained with the embodiment, three or more different kinds of color pixels may be provided as shown in FIGS. 3B and 3C. Here again, locations of microlenses may be shifted appropriately in color pixels, depending on sensitivities and colors. FIG. 3B shows a version where microlenses are shifted outwardly, and FIG. 3C shows a version where they are shifted inwardly.

Thus, the invention can regulate locations of focal points of microlenses relative to apertures of color pixels in peripheral ends of a chip independently by changing pitches or shift amounts of microlenses individually for different kinds of color pixels. Additionally, shading amounts of all color outputs can be minimized simultaneously by selecting pitches or shift amounts of microlenses in respective kinds of color pixels to minimize shading amounts of color outputs. As a result, shading amounts in a solid-state image sensor are reduced, and the yield of products is improved.

What is claimed is:

1. A solid-state image sensor comprising:
   a plurality of first color filters located with a constant pitch;
   a plurality of first lenses each associated with each said first color filter, said first lenses being located at first positions offset from center positions of said first color filters by first distances toward ends of the solid-state image sensor, said first distances increasing in a first rate from the center of the solid-state image sensor toward ends thereof;
   a plurality of first photodiodes located at said center positions of said first color filters, with a constant pitch;
   a plurality of second color filters located between said first color filters, with a constant pitch;
   a plurality of second lenses each associated with each said second color filter, said second lenses being located at second positions offset from center positions of said second color filters by second distances toward ends of the solid-state image sensor, said second distances increasing in a second rate from the center of the solid-state image sensor toward ends thereof; and
   a plurality of second photodiodes located at said center positions of said second color filters, with a constant pitch.

2. The solid-state image sensor according to claim 1 wherein said first distances and said second distances are determined independently each other, based on the wavelengths of colors filtered through said first and second color filters or refractive indices of said first and second lenses for said color, respectively.

3. The solid-state image sensor according to claim 1 wherein said first and second rates are determined on the basis of colors filtered through said first and second color filters, respectively.

4. The solid-state image sensor according to claim 2 wherein, when said wavelength for said first color filters is shorter or longer than that for said second color filters, or when said refractive index of said first color filters is larger or smaller than that of said second color filters, each said first distance of each said first color filter is determined longer or shorter than each said second distance of adjacent one of said second color filters.

5. The solid-state image sensor according to claim 1 wherein further comprising first and second color pixels, each of said first color pixels includes said first color filter, said first lense and said first photodiode, and each of said second color pixels includes said second coor filter, said second lense and said second photodiode, a plurality of said first color pixels and a plurality of said second color pixels being alternately located along horizontal or vertical rows.

6. A solid-state image sensor comprising:
   a plurality of first color filters located with a constant pitch;
   a plurality of first lenses each associated with each said first color filter, said first lenses being located at first positions offset from center positions of said first color filters by first distances toward the center of the solid-state image sensor, said first distances increasing in a first rate from the center of the solid-state image sensor toward ends thereof;
   a plurality of first photodiodes located at said center positions of said first color filters, with a constant pitch;
   a plurality of second color filters located between adjacent said first color filters, with a constant pitch;
   a plurality of second lenses each associated with each said second color filter, said second lenses being located at second positions offset from center positions of said second color filters by second distances toward the center of the solid-state image sensor, said second distances increasing in a second rate from the center of the solid-state image sensor toward ends thereof; and
   a plurality of second photodiodes located at said center positions of said second color filters with a constant pitch.

7. The solid-state image sensor according to claim 6 wherein said first distances and said second distances are determined independently each other, based on the wavelengths of colors filtered through said first and second color filters or refractive indices of said first and second lenses for said color, respectively.

8. The solid-state image sensor according to claim 6 wherein said first and second rates are determined on the basis of colors filtered through said first and second color filters, respectively.

9. The solid-state image sensor according to claim 7 wherein, when said wavelength for said first color filters is shorter or longer than that for said second color filters, or when said refractive index of said first color filters is larger or smaller than that of said second color filters, each said first distance of each said first color filter is determined longer or shorter than each said second distance of adjacent one of said second color filters.

10. The solid-state image sensor according to claim 6 wherein further comprising first and second color pixels, each of said first color pixels includes said first color filter, said first lense and said first photodiode, and each of said second color pixels includes said second coor filter, said second lense and said second photodiode, a plurality of said first color pixels and a plurality of said second color pixels being alternately located along horizontal or vertical rows.

11. A solid-state image sensor having a plurality of color pixels each including a microlens, a color filter, and a photodiode, said color filter being one of color filters prepared for different specific colors, and each said color filter passing one of said specific colors therethrough; in color pixels which are distant from the center of said solid-state image sensor and are aligned along one of horizontal lines of said image sensor, the centers of said microlense being offset from the aperture centers of said color pixels; the offset amount of each said microlens in each said color pixel being determined with reference to said specific color thereof; in color pixels having color filters of a common color, said shift amounts being set larger as they separate from the center of said solid-state image sensor toward opposite ends thereof; each said offset amount being determined so that the focal point of said microlens for light of a color passing through said color filter in each said color pixel be nearest to the aperture center of said color pixel.

12. The solid-state image sensor according to claim 11 wherein said color pixels aligned along said horizontal line include first color pixels having color filters of a specific color and second color pixels having color filters of another specific color which are alternately aligned.

13. The solid-state image sensor according to claim 12, wherein color pixels having yellow color filters and color pixels having cyan color filters are alternately aligned on a first horizontal line; color pixels having green color filters and color pixels having magenta color filters are alternately aligned on a second horizontal line; color pixels having yellow color filters and color pixels having cyan color filters are alternately aligned on a third horizontal line, and color pixels having magenta color filters and color pixels having green color filters are alternately aligned on a fourth horizontal line.

14. The solid-state image sensor according to claim 12 wherein color pixels having first green color filters and color pixel having red color filters are alternately aligned on a first horizontal line; color pixels having blue color filters and color pixels having second green color filters are alternately aligned on a second horizontal line; color pixels having first green color filters and color pixels having red color filters are alternately aligned on a third horizontal line; and color pixels having blue color filters and color pixels having second green filters are alternately aligned on a fourth horizontal line.

15. The solid-state image sensor according to claim 11 wherein said color pixels aligned along one of said horizontal lines comprise a repetitive arrangement of different kinds of color pixels having color filters for different colors.

16. The solid-state image sensor according to claim 11 wherein said centers of said microlenses are offset outwardly from the aperture centers of the color pixels.

17. The solid-state image sensor according to claim 11 wherein said centers of said microlenses are offset inwardly from the aperture centers of the color pixels.

* * * * *